(12) United States Patent
Tsao et al.

(10) Patent No.: US 8,461,649 B2
(45) Date of Patent: *Jun. 11, 2013

(54) OPENING STRUCTURE FOR SEMICONDUCTOR DEVICE

(75) Inventors: Po-Chao Tsao, New Taipei (TW); Chang-Chi Huang, Miao-Li Hsien (TW); Ming-Tsung Chen, Hsin-Chu Hsien (TW); Feng-Yi Chang, Chiayi County (TW); Pei-Yu Chou, Tainan (TW); Jiunn-Hsiung Liao, Tainan (TW); Chih-Wen Feng, Tainan (TW); Ying-Chih Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/234,159

(22) Filed: Sep. 16, 2011

(65) Prior Publication Data
US 2012/0001338 A1 Jan. 5, 2012

Related U.S. Application Data

(63) Continuation of application No. 12/884,198, filed on Sep. 17, 2010, now Pat. No. 8,164,141, which is a continuation-in-part of application No. 12/042,340, filed on Mar. 5, 2008, now Pat. No. 8,236,702, which is a continuation-in-part of application No. 11/163,149, filed on Oct. 6, 2005, now Pat. No. 7,825,034, said application No. 12/884,198 is a continuation-in-part of application No. 11/163,149, filed on Oct. 6, 2005, now Pat. No. 7,825,034.

(51) Int. Cl.
*H01L 29/78* (2006.01)

(52) U.S. Cl.
USPC .......................................................... 257/344

(58) Field of Classification Search
CPC .................................................. H01L 21/8242
USPC ..................................................... 257/344, 758
See application file for complete search history.

(56) References Cited

U.S. PATENT DOCUMENTS

| 6,093,641 A | 7/2000 | Park |
| 6,291,888 B1 | 9/2001 | Bhat |

(Continued)

FOREIGN PATENT DOCUMENTS

| CN | 1337740 A | 2/2002 |
| CN | 1519953 A | 8/2004 |

OTHER PUBLICATIONS

Wen Zheng Jian et al., "Dielectrics barrier layer of contact for narrow contact hole", Invention Disclosure, Jun. 21, 2004, p. 1-2.

*Primary Examiner* — Nathan Ha
(74) *Attorney, Agent, or Firm* — Winston Hsu; Scott Margo

(57) ABSTRACT

An opening structure is disclosed. The opening structure includes: a semiconductor substrate; at least one dielectric layer disposed on the semiconductor substrate, wherein the dielectric layer has a plurality of openings exposing the semiconductor substrate, and each of the openings has a sidewall; a dielectric thin film covering at least a portion of the sidewall of each of the openings; an etch stop layer disposed between the semiconductor substrate and the dielectric layer and extending partially into the openings to isolate the dielectric thin film from the semiconductor substrate; and a metal layer filled in the openings.

9 Claims, 9 Drawing Sheets

U.S. PATENT DOCUMENTS

| | | |
|---|---|---|
| 6,306,759 B1 | 10/2001 | Yen |
| 6,432,814 B1 | 8/2002 | Steiner |
| 6,448,134 B2 * | 9/2002 | Kim ................... 438/253 |
| 6,448,644 B1 * | 9/2002 | Lin ..................... 257/734 |
| 6,448,655 B1 * | 9/2002 | Babich et al. ........ 257/759 |
| 6,451,708 B1 * | 9/2002 | Ha ...................... 438/738 |
| 6,452,273 B1 * | 9/2002 | Kim et al. ............ 257/754 |
| 6,492,263 B1 | 12/2002 | Peng |
| 6,569,760 B1 | 5/2003 | Lin |
| 6,645,857 B1 | 11/2003 | Whitefield |
| 6,713,310 B2 | 3/2004 | Song |
| 7,112,506 B2 | 9/2006 | Kim |
| 7,256,502 B2 | 8/2007 | Chung |
| 7,825,034 B2 | 11/2010 | Tsao |
| 7,829,410 B2 | 11/2010 | Plum |
| 8,236,702 B2 | 8/2012 | Chang |
| 2003/0013253 A1 | 1/2003 | Hurley |
| 2003/0119271 A1 | 6/2003 | Aggarwal |
| 2004/0018712 A1 | 1/2004 | Plas |
| 2004/0067616 A1 | 4/2004 | Hachisuka |
| 2004/0169224 A1 | 9/2004 | Ebihara |
| 2004/0203176 A1 | 10/2004 | Zhao |
| 2005/0074965 A1 | 4/2005 | Lee |
| 2005/0142862 A1 | 6/2005 | Chun |
| 2007/0059885 A1 | 3/2007 | Hachisuka |
| 2007/0210454 A1 | 9/2007 | Chou |
| 2008/0157224 A1 | 7/2008 | Fischer |
| 2008/0251850 A1 | 10/2008 | Bu |
| 2008/0251855 A1 | 10/2008 | Besser |
| 2009/0001453 A1 | 1/2009 | Richter |
| 2009/0068833 A1 | 3/2009 | Choi |
| 2009/0321837 A1 | 12/2009 | Wei |

\* cited by examiner

OPENING STRUCTURE FOR SEMICONDUCTOR DEVICE

CROSS REFERENCE TO RELATED APPLICATIONS

This application is a continuation application of U.S. patent application Ser. No. 12/884,198 filed Sep. 17, 2010, which is a continuation-in-part of U.S. patent application Ser. No. 12/042,340 filed Mar. 5, 2008, which is a continuation-in-part of U.S. patent application Ser. No. 11/163,149 filed Oct. 6, 2005. U.S. patent application Ser. No. 12/884,198 is also a continuation-in-part of U.S. patent application Ser. No. 11/163,149 filed Oct. 6, 2005.

BACKGROUND OF THE INVENTION

1. Field of the Invention

The present invention relates to an opening structure, and more particularly, to an opening structure having a metal layer filled in an opening, and the sidewall of the opening is covered with a dielectric thin film.

2. Description of the Prior Art

The trend to micro-miniaturization, or the ability to fabricate semiconductor devices with feature size smaller than 0.065 micrometers, has presented difficulties when attempting to form contact holes (especially for high aspect ratio contact holes) in a dielectric layer to expose underlying conductive regions.

Please refer to FIGS. 1-4. FIGS. 1-4 are schematic, cross-sectional diagrams showing the process of forming contact holes in accordance with the prior art method. As shown in FIG. 1, a metal-oxide-semiconductor (MOS) transistor device 20 is formed on a semiconductor substrate 10. The MOS transistor device 20, which is isolated by shallow trench isolations (STIs) 24, includes source/drain regions 12, a gate electrode 14, and a spacer structure 16 disposed on the sidewalls of the gate electrode 14. The semiconductor substrate 10 further includes a contact etch stop layer (CESL) 32 deposited over the MOS transistor device 20 and the semiconductor substrate 10, and an inter-layer dielectric (ILD) layer 34 deposited on the contact etch stop layer 32. Subsequently, a bottom anti-reflective coating (BARC) layer 36 is deposited on the ILD layer 34. Then, a photoresist layer 40 is formed on the BARC layer 36, and a conventional exposure-and-development process is carried out to form openings 42 in the photoresist layer 40 to define the locations of contact holes to be formed later.

As shown in FIG. 2, using the photoresist layer 40 as an etching hard mask to etch the exposed BARC layer 36 and the ILD layer 34 through the openings 42 so as to form openings 44. The etching of the ILD layer 34 stops on the contact etch stop layer 32. Subsequently, as shown in FIG. 3, using the remaining photoresist layer 40 and the BARC layer 36 as an etching hard mask to etch the exposed contact etch stop layer 32 through the openings 44, thereby forming contact holes 46. As shown in FIG. 4, the remaining photoresist layer 40 and the BARC layer 36 over the ILD layer 34 are removed.

The above-described prior art method of forming contact holes has several drawbacks. First, when etching the CESL layer 32, the contact profile is also impaired due to the low etching selectivity between the ILD layer 34 and the contact etch stop layer 32. Second, the ILD layer 34 and the underlying CESL layer 32 are etched in-situ, without removing the photoresist layer 40. The polymer residue produced during the etching of the ILD layer 34 and the CESL layer 32 results in a tapered profile of the contact hole 46, thereby reducing the exposed surface area of the source/drain regions 12 and increasing the contact sheet resistance.

In light of the above, there is a need in this industry to provide an improved method of fabricating contact holes in which the contact sheet resistance is reduced without affecting the contact hole profile formed in the ILD layer.

SUMMARY OF THE INVENTION

It is therefore one of the objectives of the present invention to provide an opening structure with low contact sheet resistance.

According to the present invention, an opening structure is disclosed. The opening structure includes: a semiconductor substrate; at least one dielectric layer disposed on the semiconductor substrate, wherein the dielectric layer has a plurality of openings exposing the semiconductor substrate, and each of the openings has a sidewall; a dielectric thin film covering at least a portion of the sidewall of each of the openings; an etch stop layer disposed between the semiconductor substrate and the dielectric layer and extending partially into the openings to isolate the dielectric thin film from the semiconductor substrate; and a metal layer filled in the openings.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
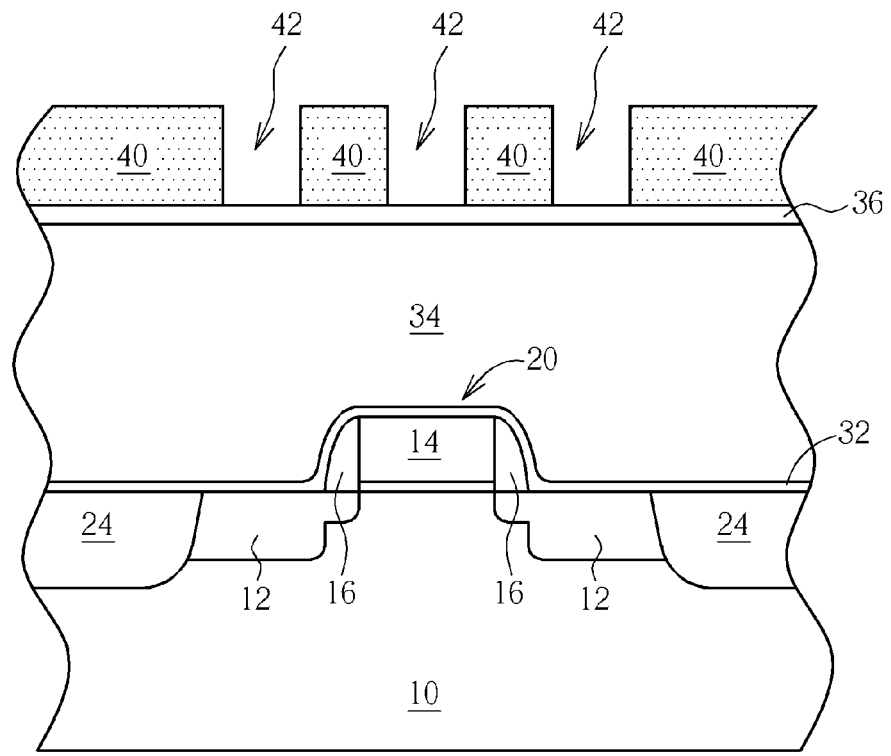
FIGS. 1-4 are schematic, cross-sectional diagrams showing the process of forming contact holes in accordance with the prior art method.
Figure 2:
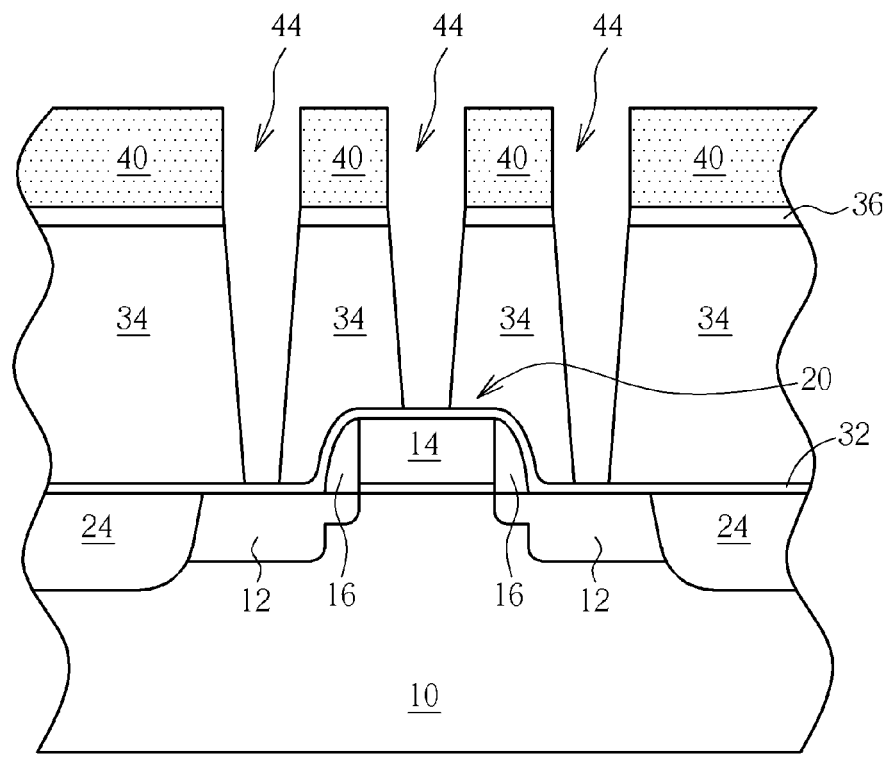
Figure 3:
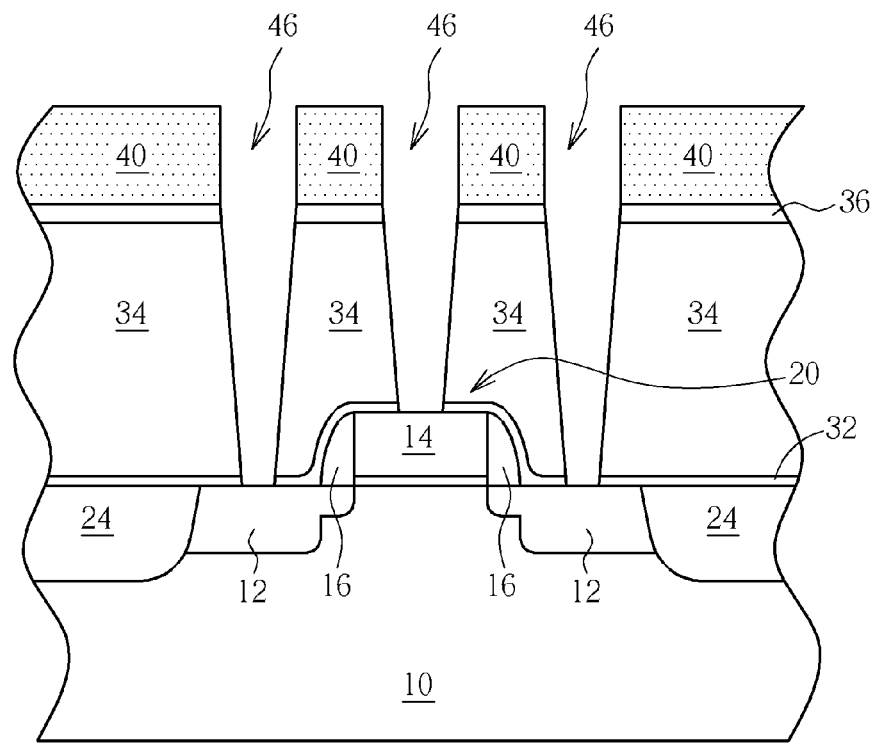
Figure 4:
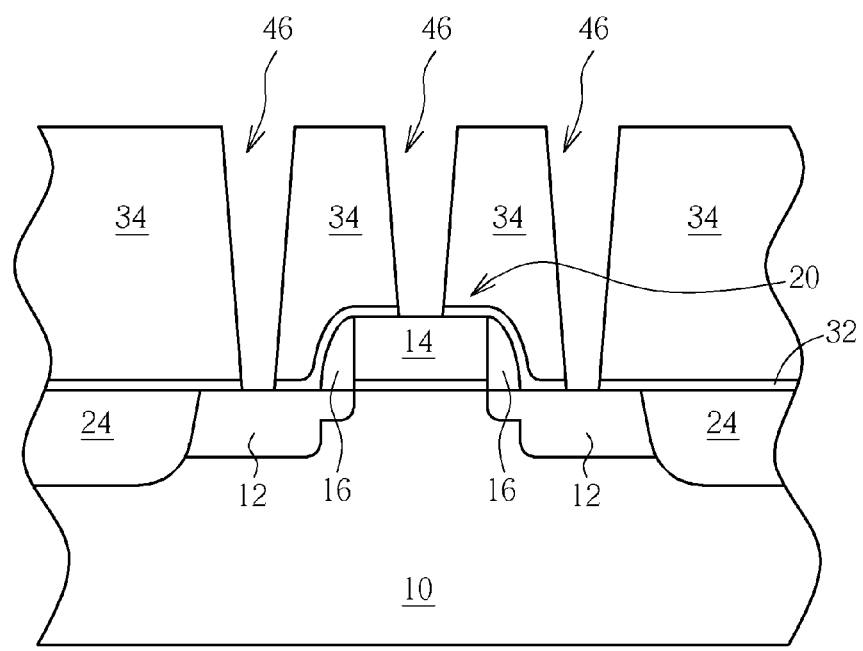
Figure 5:
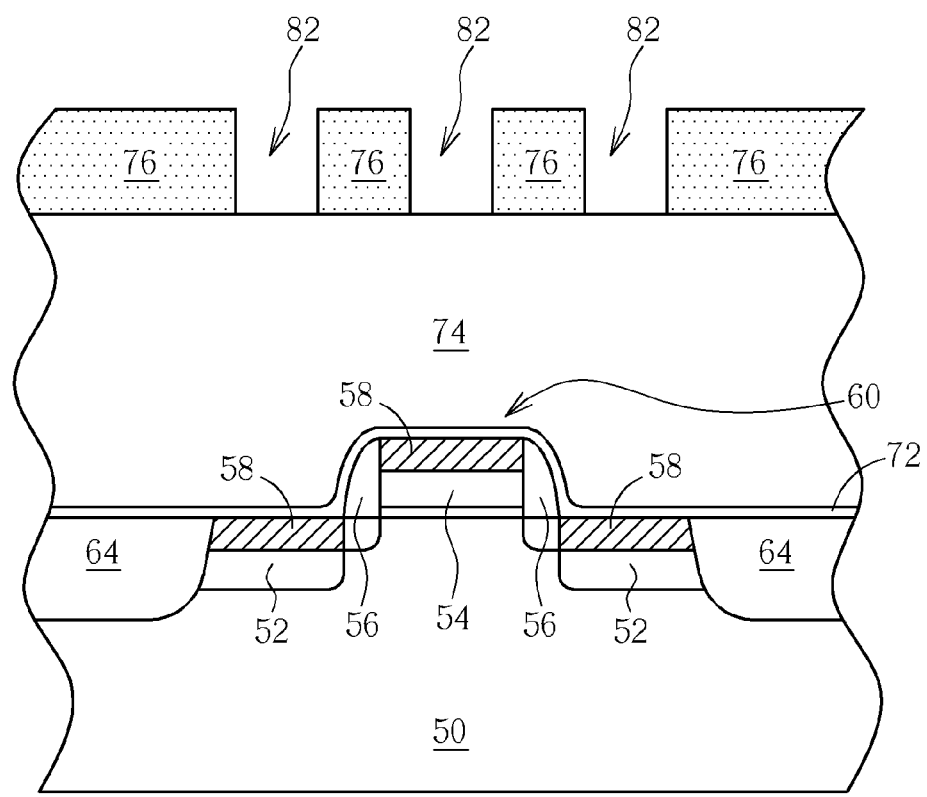
FIGS. 5-9 are schematic, cross-sectional diagrams illustrating a method of forming an opening structure in accordance with a preferred embodiment of the present invention.

Please refer to FIGS. 5-9. FIGS. 5-9 are schematic, cross-sectional diagrams illustrating a method of forming an opening structure in accordance with a preferred embodiment of the present invention. In this embodiment, a method of forming a contact plug structure is exemplarily illustrated. As shown in FIG. 5, a MOS transistor device 60 is formed on a semiconductor substrate 50. The MOS transistor device 60, which is isolated by shallow trench isolations 64, includes source/drain regions 52, a gate electrode 54, and a spacer structure 56 disposed on the sidewalls of the gate electrode 54. The MOS transistor device 60 may further includes salicides 58 disposed on the surface of the gate electrode 54 and the source/drain regions 52. The semiconductor substrate 50 further includes a contact etch stop layer 72 deposited over the MOS transistor device 60 and the semiconductor substrate 50, and a dielectric layer e.g. an inter-layer dielectric (ILD) layer 74, deposited on the contact etch stop layer 72. Specifically, the etch stop layer 72 is disposed between the semiconductor substrate 50 and the ILD layer 74.

In selecting the materials of the ILD layer 74 and the contact etch stop layer 72, etching selectivity should be concerned. Normally, the ILD layer 74 may includes tetraethylorthosilicate (TEOS) oxide, un-doped silicon glass, or doped silicon oxide such as borophosphosilicate glass (BPSG), FSG, PSG or BSG. Plasma-enhanced chemical vapor deposition (PECVD) method or other deposition techniques may be used to deposit the ILD layer 74.

Subsequently, a mask layer 76 having a plurality of openings 82 is formed on the ILD layer 74. The openings 82 are disposed corresponding to the gate electrode 54 and the source/drain regions 52 so as to define the locations of contact holes. The mask layer 76 may includes a photoresist layer, a metal layer, or a dielectric layer. Preferably, the mask layer 76 is a metal layer or a dielectric layer such as a silicon nitride layer, so as to prevent polymer residues generated in etching the ILD layer 74.

Figure 6:
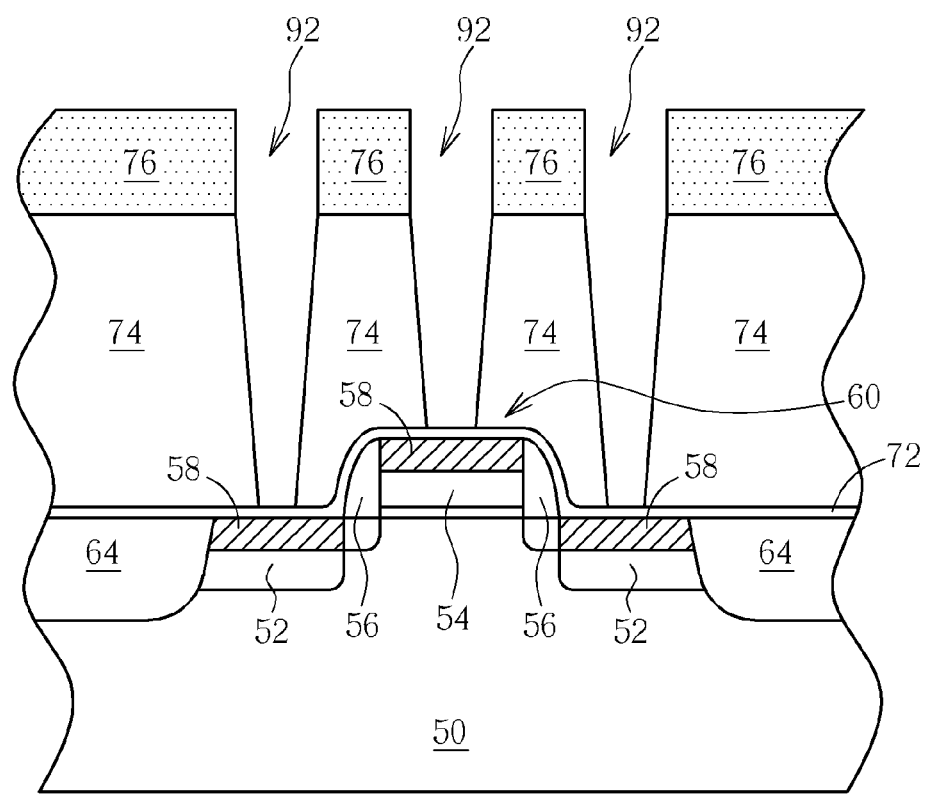
Figure 7:
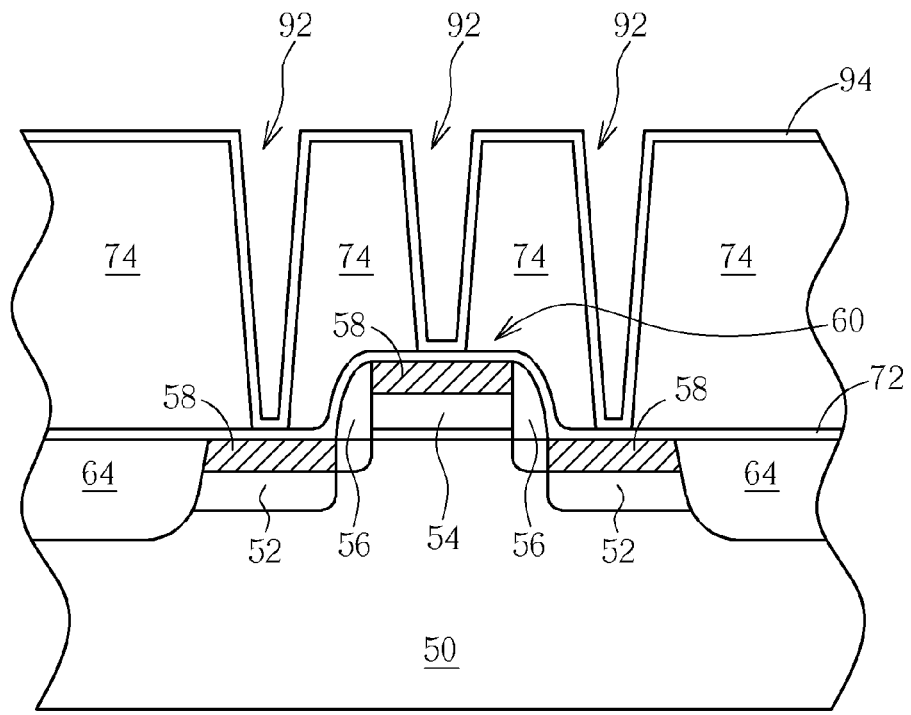

As shown in FIG. 6, an anisotropic etching process is performed using the mask layer 76 as an etching hard mask to etch the ILD layer 74 through the openings 82. The etching stops on the contact etch stop layer 72 so as to form a plurality of openings 92. As shown in FIG. 7, the mask layer 76 is then removed, and a clean process is performed to remove polymer residues or particles remaining in the sidewalls of the openings 92. The clean process can be a wet clean process or a dry clean process, and can be performed in-situ or ex-situ. Then, a dielectric thin film 94 is formed on the ILD layer 74, the sidewalls of the openings 92, and the exposed contact etch stop layer 72. In this embodiment, the contact hole to be formed has a feature size of between 50 and 100 nm (preferably 65 nm), and therefore the thickness of the dielectric thin film 94 is preferably between 0.5 to 10 nm. However, the thickness of the dielectric thin film 94 can be altered in accordance with different process feature size. The dielectric thin film 94 may include a silicon oxide thin film, a silicon nitride thin film, a silicon oxynitride thin film, etc. The dielectric thin film 94 may also be a high k material having a dielectric constant larger than 3.9. For instance, the dielectric thin film 94 may include tantalum oxide thin film, a titanium oxide thin film, a zirconium oxide thin film, a hafnium oxide thin film, hafnium silicon oxide thin film, hafnium silicon oxynitride, etc. The dielectric thin film 94 can be formed by different deposition techniques such as LPCVD, APCVD, PECVD, ALD, etc.

Figure 8:
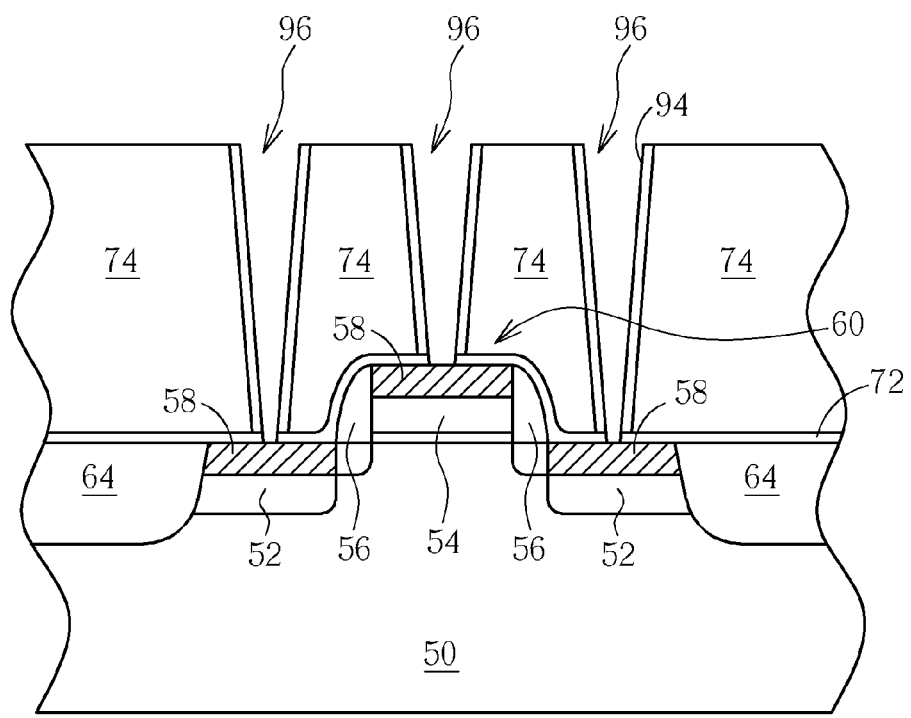

As shown in FIG. 8, an etch back process is performed to etch the dielectric thin film 94 disposed on the ILD layer 74 and the contact etch stop layer 72. Meanwhile, the dielectric thin film 94 disposed on the sidewalls of the openings 92 is reserved. Following that, the contact etch stop layer 72 exposed through the openings 92 is etched so as to form contact holes 96 penetrating the etch stop layer 72 and exposing the semiconductor substrate 50. It is noted that since the etch stop layer 72 is etched subsequent to the formation of the dielectric thin film 94, the contact holes 96 partially expose the top surface of the etch stop layer 72, and the dielectric thin film 94 covers the top surface of the etch stop layer 72 exposed by the contact holes 96. It should be appreciated that at least a surface treatment may be carried out when the contact holes 96 are formed. For instance, an implantation process can be performed to reduce the resistance of the gate electrode 54 and the source/drain regions 52. Or a clean process can be performed to clean the sidewalls of the contact holes 96 for improving the reliability of the contact plugs to be formed later.

Figure 9:
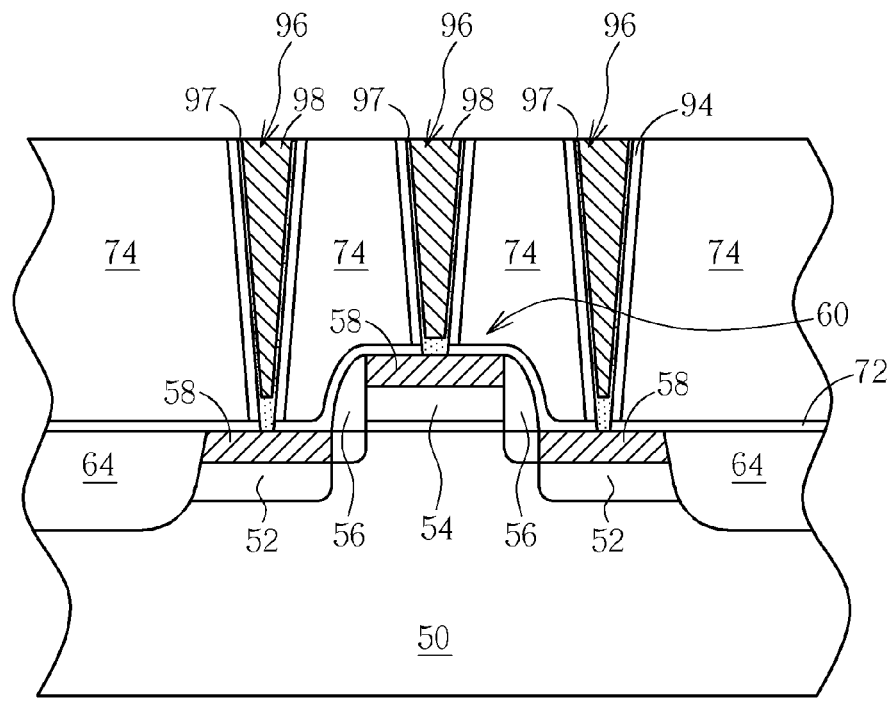

As shown in FIG. 9, at least one barrier layer 97 may be optionally, conformally formed on the sidewall of the contact holes 96. The barrier layer 97 may be a single-layered barrier layer or a composite-layered barrier layer. The material of the barrier layer 97 may be metal e.g. tantalum (Ta), titanium (Ti), tungsten (W), alloy e.g. TiW or metal compound e.g. tantalum nitride (TaN), titanium nitride (TiN). The barrier layer 97 may be a barrier layer with stress so as to enhance the adhesion of a metal layer to be formed. Then, a metal layer 98 is filled into the contact holes 96, and a planarization process e.g. a CMP process is performed to remove the metal layer 98 outside the contact holes 96 to form a plurality of contact plugs respectively in the contact holes 96. The material of the metal layer 98 may be, for example, W, copper (Cu), aluminum (Al), but not limited thereto.

Figure 10:
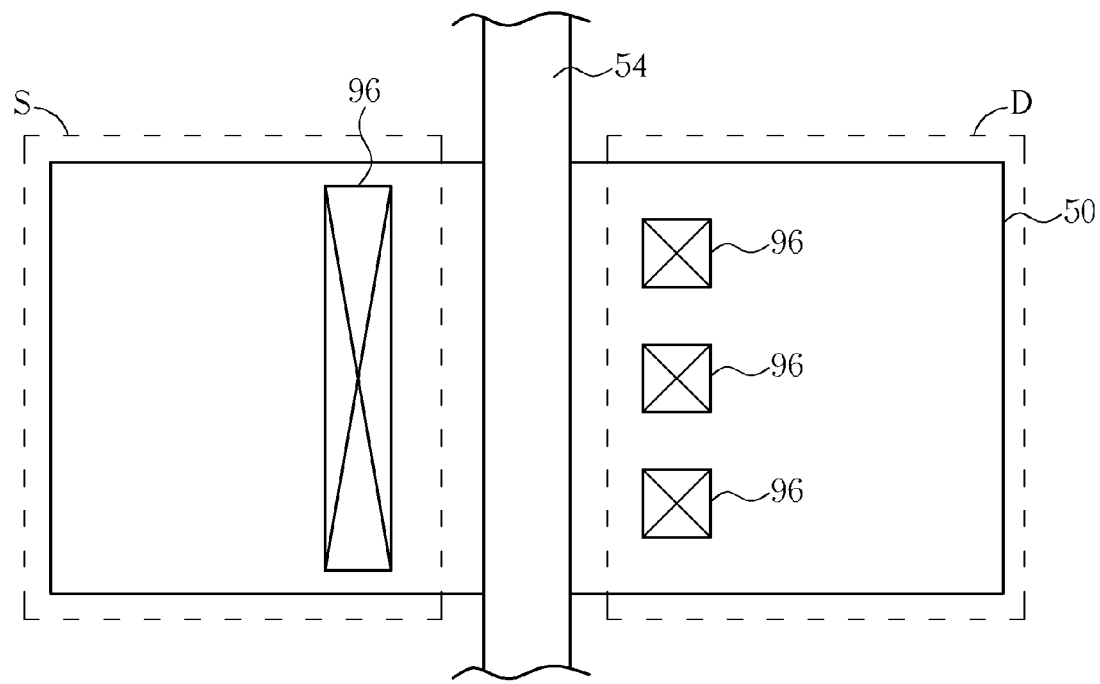
FIG. 10 is a schematic, top-view diagram illustrating the opening structure according to this embodiment of the present invention.

Please refer to FIG. 10, as well as FIGS. 5-9. FIG. 10 is a schematic, top-view diagram illustrating the opening structure according to this embodiment of the present invention. As shown in FIG. 10, each of the contact holes 96 is a slot contact hole, e.g. a rectangular or a square contact hole 96. In addition, a portion of the slot contact holes 96 is disposed in a source region S of the semiconductor substrate 50, and a portion of the slot contact holes 96 is disposed in a drain region D of the semiconductor substrate 50. The portion of the slot contact holes 96 disposed in the source region S of the semiconductor substrate 50 and the portion of the slot contact holes 96 disposed in the drain region D of the semiconductor substrate 50 are arranged asymmetrically. The slot contact hole 96 disposed in the source region S of the semiconductor substrate 50 and the slot contact hole 96 disposed in the drain region D of the semiconductor substrate 50 may be different in size. Specifically, the slot contact hole 96 disposed in the source region S is rectangular in shape, while the slot contact hole 96 disposed in the drain region D is square in shape, but not limited thereto. Also, the slot contact hole 96 disposed in the source region S of the semiconductor substrate 50 and the slot contact hole 96 disposed in the drain region D of the semiconductor substrate 50 may be different in number. Specifically, there is one slot contact hole 96 disposed in the source region S, while there are three slot contact hole 96 disposed in the drain region D, but not limited thereto.

Figure 11:
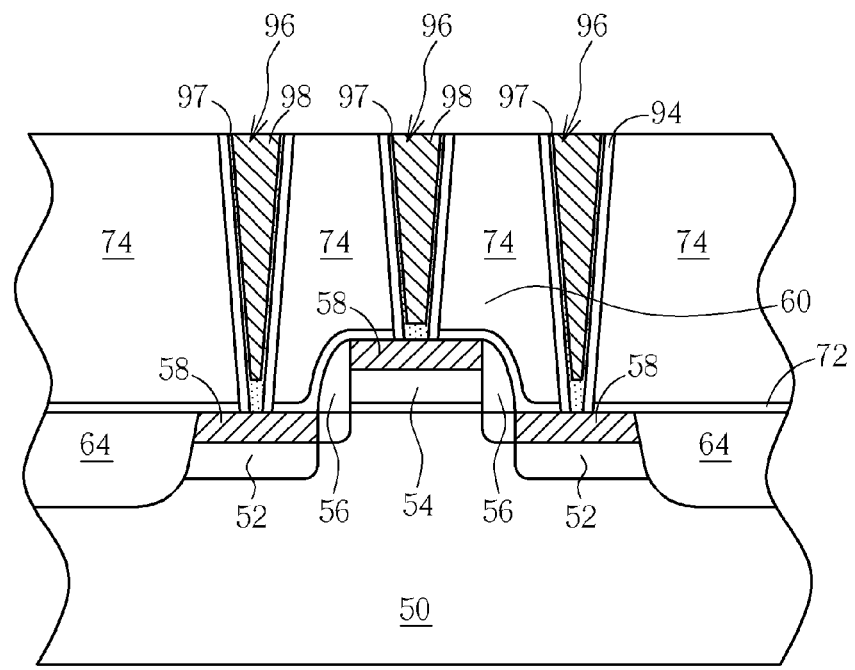
FIG. 11 is a schematic, cross-sectional diagram illustrating an opening structure according to a variant embodiment of the present invention.

Please refer to FIG. 11. FIG. 11 is a schematic, cross-sectional diagram illustrating a contact plug structure according to a variant embodiment of the present invention. As shown in FIG. 11, in this embodiment, the etch stop layer 72 is etched prior to the formation of the dielectric thin film 94, thus the sidewall of the etch stop layer 72 is exposed by the contact holes 96, and the dielectric thin film 94 covers the sidewall of the etch stop layer 72.

It is to be noted that in the present invention, the opening structure is not limited to be a contact hole, and can be various openings such as a via hole or a trench.

Figure 12:
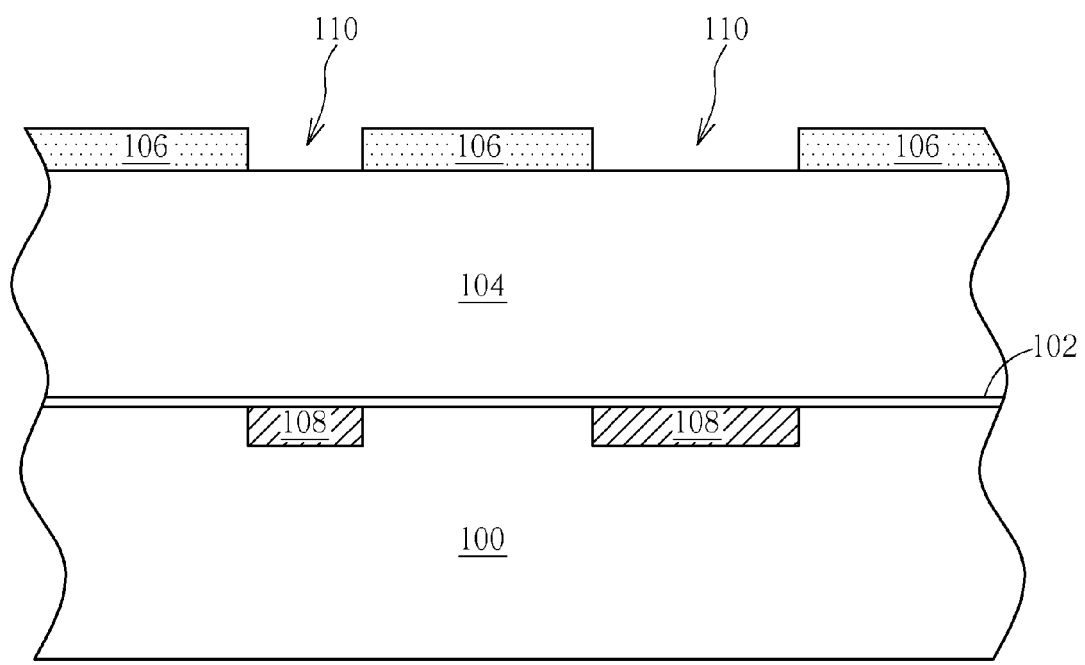
FIGS. 12-16 are schematic, cross-sectional diagrams illustrating a method of an opening structure in accordance with another preferred embodiment of the present invention.

Please refer to FIGS. 12-16. FIGS. 12-16 are schematic, cross-sectional diagrams illustrating a method of an opening structure in accordance with another preferred embodiment of the present invention. As shown in FIG. 12, a semiconductor substrate 100 including an etch stop layer 102, a dielectric layer 104, and a mask layer 106 is provided. The semiconductor substrate 100 further has a conductive pattern 108, and the mask layer 106 includes a plurality of openings 110 disposed corresponding to the conductive pattern 108.

Figure 13:
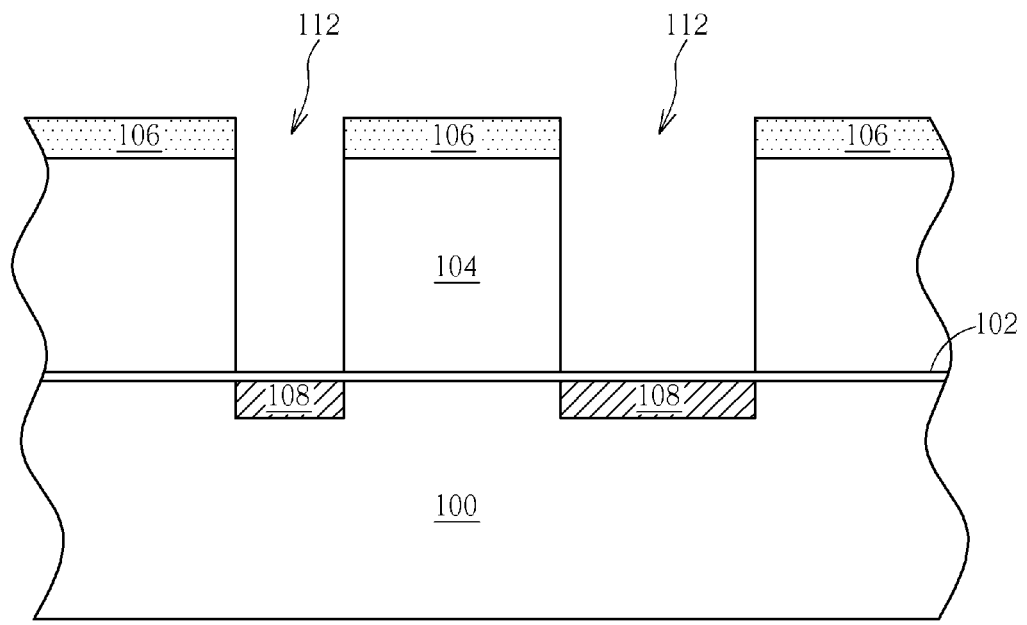
Figure 14:
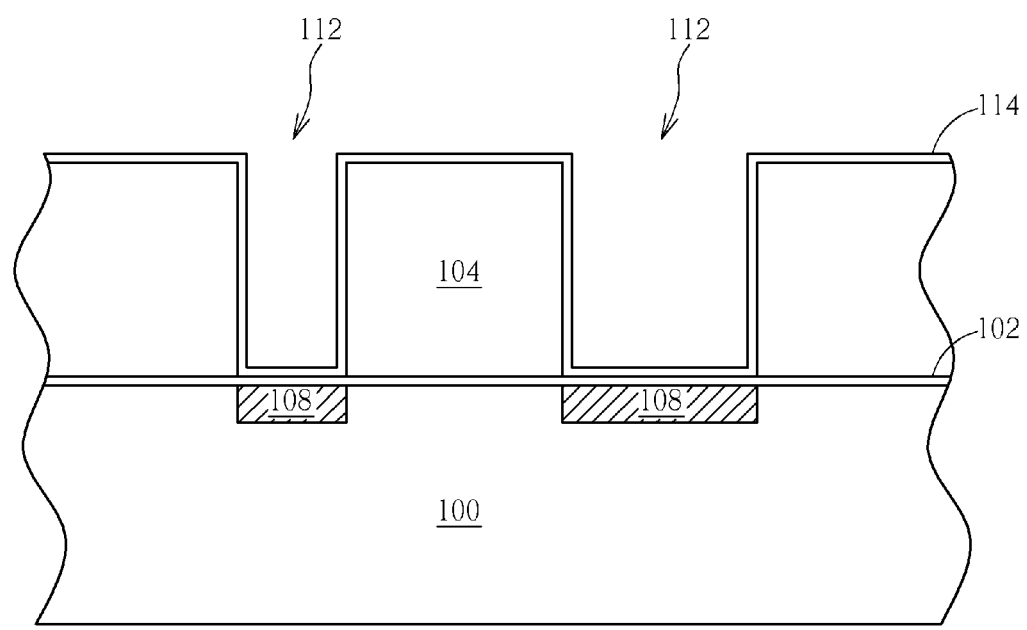
Figure 15:
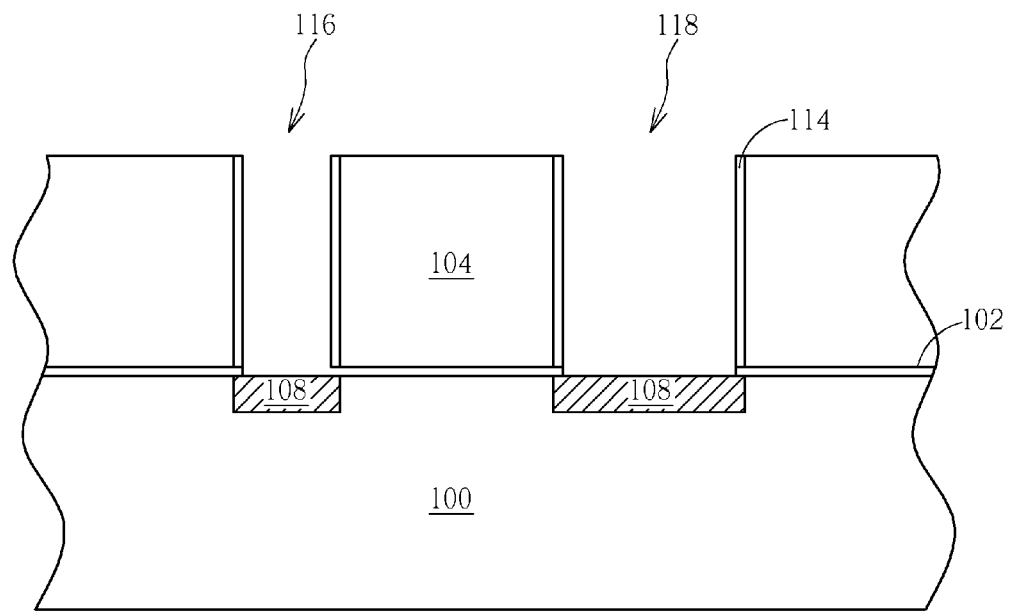

As shown in FIG. 13, an anisotropic etching process is performed using the mask layer 106 as an etching hard mask to form a plurality of openings 112 which expose the etch stop layer 102 in the dielectric layer 104. It is noted that the openings 112 can be a contact hole, a via hole or a trench. For example, the opening 112 in the left portion of FIG. 13 with smaller dimension may be a via hole, and the opening 112 in the right portion with larger dimension may be a trench. The opening 112 may also be a trench-and-via opening of a dual damascene structure. As shown in FIG. 14, the mask layer 106 is removed, and a dielectric thin film 114 is deposited on the dielectric layer 104, the sidewalls of the openings 112, and the exposed etch stop layer 102. As shown in FIG. 15, an etch back process is performed to etch the dielectric thin film 114 disposed on the dielectric layer 104 and the exposed etch stop layer 102. Following that, the exposed etch stop layer 102 is etched so as to form a via hole 116 and a trench 118. It is appreciated that a clean process may be performed subsequent to removing the mask layer 106 and a surface treatment may be carried out when the via hole 116 and the trench 118 are formed.

Figure 16:
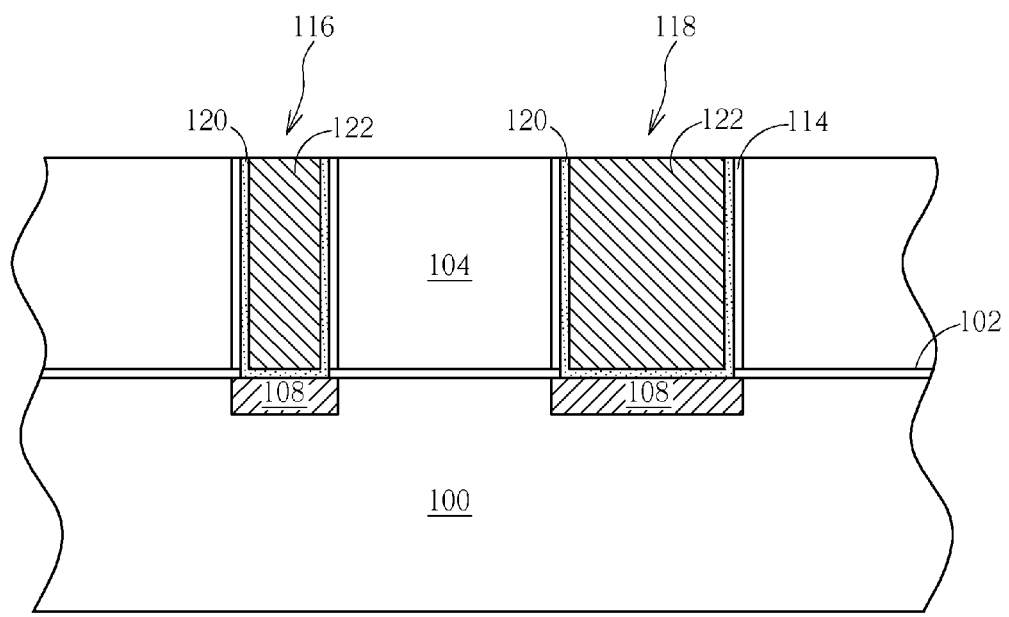

As shown in FIG. 16, at least one barrier layer 120 may be optionally, conformally formed on the sidewall of the via hole 116 and the trench 118. Then, a metal layer 122 is filled into the via hole 116 and the trench 118, and a planarization process e.g. a CMP process is performed to remove the metal layer 122 outside the via hole 116 and the trench 118. The materials of the etch stop layer 102, the dielectric layer 104, the mask layer 106, the dielectric thin film 114, the barrier layer 120 and the metal layer 122 have been disclosed in the above-described embodiment, and thus are not redundantly described here.

Figure 17:
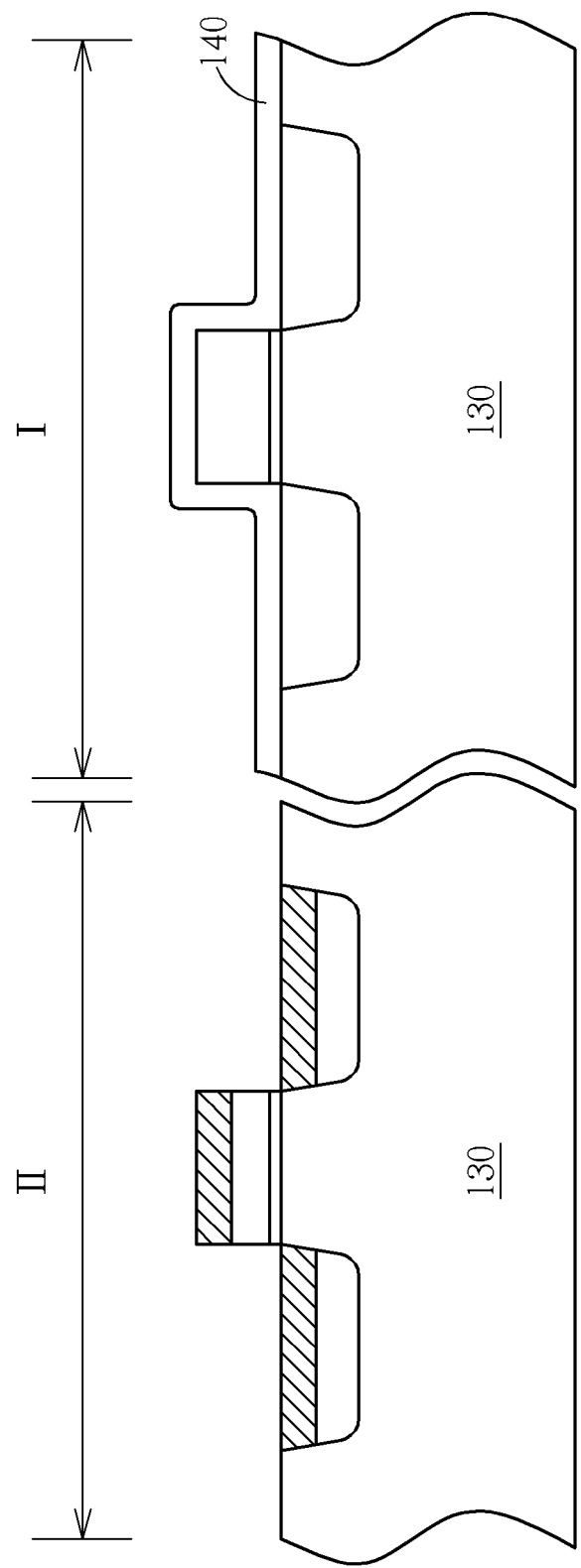
FIG. 17 is a schematic, cross-sectional diagram illustrating a method of forming an opening structure according to still another preferred embodiment of the present invention.

Another benefit of the method of the present invention is the etch stop layer may be a salicide block (SAB). Please refer to FIG. 17. FIG. 17 is a schematic, cross-sectional diagram illustrating a method of forming an opening structure according to still another preferred embodiment of the present invention. As shown in FIG. 17, a semiconductor substrate 130 is provided. The semiconductor substrate 130 is divided into a first device region I e.g. an ESD device region or a memory array region, and a second device region II e.g. a logic device region. Normally, the gate electrode and the source/drain regions of a logic device require salicides, while those of an ESD device or a memory device do not. Therefore, the first device region I is covered with an SAB 140 while performing a salicidation process. In this embodiment, the SAB 140 covering the first device region 140 is kept and used as an etch stop layer in etching a dielectric layer. In such a case, the process step is reduced. It is to be noted that the steps of forming the openings and the metal plug have been clearly described in the aforementioned embodiments, and thus are not redundantly described here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An opening structure, comprising:
   a semiconductor substrate;
   at least one dielectric layer disposed on the semiconductor substrate, wherein the dielectric layer has a plurality of openings exposing the semiconductor substrate, and each of the openings has a sidewall;
   a dielectric thin film covering at least a portion of the sidewall of each of the openings;
   an etch stop layer disposed between the semiconductor substrate and the dielectric layer and extending partially into the openings to isolate the dielectric thin film from the semiconductor substrate, wherein the dielectric thin film is disposed on the etch stop layer; and
   a metal layer filled in the openings.

2. The opening structure of claim 1, wherein a material of the metal layer comprises tungsten, copper or aluminum.

3. The opening structure of claim 1, further comprising at least one barrier layer conformally formed on the sidewall of the openings, disposed between the dielectric layer and the metal layer, and disposed between the semiconductor substrate and the metal layer.

4. The opening structure of claim 1, wherein each of the openings comprising a contact hole, a via hole or a trench.

5. The opening structure of claim 1, wherein each of the openings is a slot contact hole.

6. The opening structure of claim 5, wherein a portion of the slot contact holes is disposed in a source region of the semiconductor substrate, and a portion of the slot contact holes is disposed in a drain region of the semiconductor substrate.

7. The opening structure of claim 6, wherein the portion of the slot contact holes disposed in the source region of the semiconductor substrate and the portion of the slot contact holes disposed in the drain region of the semiconductor substrate are arranged asymmetrically.

8. The opening structure of claim 6, wherein the slot contact hole disposed in the source region of the semiconductor substrate and the slot contact hole disposed in the drain region of the semiconductor substrate are different in size.

9. The opening structure of claim 6, wherein the slot contact hole disposed in the source region of the semiconductor substrate and the slot contact hole disposed in the drain region of the semiconductor substrate are different in number.

\* \* \* \* \*